United States Patent
Webb et al.

(10) Patent No.: US 7,097,923 B2
(45) Date of Patent: Aug. 29, 2006

(54) METHOD FOR FORMING THIN FILM HEADS USING A TRI-LAYER ANTI-REFLECTION COATING FOR PHOTOLITHOGRAPHIC APPLICATIONS AND A STRUCTURE THEREOF

(75) Inventors: Patrick R. Webb, San Jose, CA (US); Howard G. Zolla, San Jose, CA (US)

(73) Assignee: Hitachi Global Storage Technologies, Netherlands (NL)

( * ) Notice: Subject to any disclaimer, the term of this patent is extended or adjusted under 35 U.S.C. 154(b) by 5 days.

(21) Appl. No.: 10/135,663

(22) Filed: Apr. 30, 2002

(65) Prior Publication Data

US 2003/0203237 A1    Oct. 30, 2003

(51) Int. Cl.
*G11B 5/127* (2006.01)
*B05D 5/12* (2006.01)

(52) U.S. Cl. ............ 428/816; 428/212; 428/213; 428/469; 427/404; 427/419.2; 427/419.3; 427/419.7; 427/419.8

(58) Field of Classification Search ........... 438/692; 428/701, 702, 209, 210
See application file for complete search history.

(56) References Cited

U.S. PATENT DOCUMENTS

| | | | |
|---|---|---|---|
| 4,857,373 A | 8/1989 | Carcia et al. | |
| 5,286,608 A * | 2/1994 | Koh | 430/313 |
| 5,288,558 A | 2/1994 | Nothe | |
| 5,314,596 A * | 5/1994 | Shukovsky et al. | 204/192.2 |
| 5,368,908 A | 11/1994 | Ohta et al. | |
| 5,759,746 A | 6/1998 | Azuma et al. | |
| 5,926,740 A | 7/1999 | Forbes et al. | |
| 5,963,841 A | 10/1999 | Karlsson et al. | |
| 5,998,100 A | 12/1999 | Azuma et al. | |
| 6,005,277 A | 12/1999 | Liu et al. | |
| 6,010,829 A | 1/2000 | Rogers et al. | |
| 6,037,276 A | 3/2000 | Lin et al. | |
| 6,051,369 A | 4/2000 | Azuma et al. | |
| 6,136,679 A | 10/2000 | Yu et al. | |
| 6,156,485 A | 12/2000 | Tang et al. | |
| 6,165,855 A | 12/2000 | Besser et al. | |
| 6,200,734 B1 | 3/2001 | Blatchford, Jr. et al. | |
| 6,274,292 B1 * | 8/2001 | Holscher et al. | 430/313 |

(Continued)

FOREIGN PATENT DOCUMENTS

JP    2000-020915 A  *  1/2000

(Continued)

OTHER PUBLICATIONS

JPO Abstract Translation of JP 2000-020915 (Patent Abstracts of Japan).*

(Continued)

*Primary Examiner*—Kevin M. Bernatz
(74) *Attorney, Agent, or Firm*—Chambliss, Bahner, & Stophel; David W. Lynch

(57) ABSTRACT

A tri-layer anti-reflective coating for use in photolithographic applications, and specifically, for use in ultraviolet photolithographic processes. The tri-layered anti-reflective coating is used to minimize pattern distortion due to reflections from neighboring features in the construction of microcircuits. The tri-layer anti-reflection coating features a first layer, a first dielectric layer, an absorption layer disposed on the first dielectric layer, and a second dielectric layer, which is then disposed between the absorption layer and a photoresist layer. At least the absorption layer and dielectric layers can be formed using vacuum deposition. A unique character of the tri-layer anti-reflective coatings is that it dampens reflections structures having severe topologies and also allows a thinner anti-reflection layer that has a wider process latitude.

36 Claims, 5 Drawing Sheets

U.S. PATENT DOCUMENTS

| | | | |
|---|---|---|---|
| 6,282,776 B1 * | 9/2001 | Otsuka et al. | 29/603.14 |
| 6,316,167 B1 * | 11/2001 | Angelopoulos et al. | 430/313 |
| 6,323,067 B1 * | 11/2001 | Ning | 438/132 |
| 6,346,183 B1 * | 2/2002 | Baer et al. | 205/119 |
| 6,428,894 B1 * | 8/2002 | Babich et al. | 428/408 |
| 6,501,618 B1 * | 12/2002 | Kamijima et al. | 360/126 |
| 6,534,425 B1 * | 3/2003 | Karr et al. | 250/492.2 |
| 6,751,022 B1 * | 6/2004 | Phillips | 359/577 |
| 6,974,766 B1 * | 12/2005 | Huang | 438/624 |
| 2002/0195419 A1 * | 12/2002 | Pavelchek | 216/16 |

FOREIGN PATENT DOCUMENTS

| JP | 2001-185531 A | * | 7/2001 |
|---|---|---|---|
| JP | 2001-229513 | * | 8/2001 |

OTHER PUBLICATIONS

Derwent Abstract of JP 2001-185531-A (Derwent Acc. No. 2002-245715).*

Machine Translation of JP 2001-185531-A.*

Choi et al., "A Novel Anti-Reflective Structure for Metal Layer Patterning," Proceedings of SPIE, vol. 333, Part 1, Feb. 23-25, 1998, pp. 336-346.

Lin et al., "Dual Layer Inorganic SiON Bottom ARC for 0.25 μm DUV Hard Mask Appliclations," Proceedings of SPIE, vol. 3678, Mar. 1999, pp. 186-197.

* cited by examiner

METHOD FOR FORMING THIN FILM HEADS USING A TRI-LAYER ANTI-REFLECTION COATING FOR PHOTOLITHOGRAPHIC APPLICATIONS AND A STRUCTURE THEREOF

CROSS-REFERENCE TO RELATED APPLICATION

This application is related to the following co-pending and commonly-assigned U.S. patent application, which is hereby incorporated herein by reference in their respective entirety: "METHOD FOR FORMING THIN FILM HEADS USING A BI-LAYER ANTI-REFLECTION COATING FOR PHOTOLITHOGRAPHIC APPLICATIONS AND A STRUCTURE THEREOF" to Kruger et al., having U.S. patent application Ser. No. 10/135,754, filed on Apr. 30 2002.

BACKGROUND OF THE INVENTION

1. Field of the Invention

The present invention relates to photolithographic techniques used in thin-film head (TFH) processing. More particularly, the present invention relates to tri-layer anti-reflective coatings that minimize pattern distortion due to reflections from features having severely angled topologies.

2. Description of Related Art

Thin-film magnetic recording heads have gained wide acceptance in the data storage industry. A thin-film recording head has small, precisely formed structures that are formed using several thin-film deposition approaches. Manufacturers seek to form the geometry of the recording heads with high precision, and to thereby achieve geometries that provide magnetic field patterns suitable for writing narrow tracks of recorded data.

Typically, the lithographic technique deposits alternating layers of conductive and insulating materials onto a substrate by evaporation, sputtering, plating, or other deposition technique that provides precise control of the deposition thickness. Chemical etching, reactive ion etching (RIE), or other mechanisms shape and form the deposited layers into a pole-tip assembly having the desired geometry. Thus, the head structure is a multi-layer lithographically fabricated device.

Although existing lithographic techniques work sufficiently well to provide head structures, e.g., pole-tip assemblies, with feature sizes suitable for current data storage capacity, these lithographic techniques are limited as to the small feature sizes that they can produce.

Thin film heads require sharply defined photoresist patterns because these patterns are used to define the locations (and density) of structures formed. In a thin film process, a thin layer of photoresist may be applied to the surface of a wafer. The wafer is heated in a process called soft baking, wherein partial evaporation of photoresist solvents evaporate. A mask is then aligned over the wafer, wherein the mask allows light to pass through its clear areas and be blocked by opaque areas during a light exposure step. However, during the exposure step, light reflects from the surface of an underlying substrate (or neighboring features) over which the photoresist is formed. For example, materials that are used to form the thin film head structure are highly reflective, e.g., copper, tantalum and alloys of nickel, iron and cobalt. Reflections from the surface of the substrate underlying the photoresist also causes deleterious effects that limit the resolution of photolithographic photoresist patterning.

These deleterious effects are caused during the development step by light passing through the photoresist at least twice, rather than only once. This occurs because light is reflected from a surface of the underlying substrate and components (or features) and passes back through the photoresist layer a second time. The chemical structure of the photoresist changes differently when light passes through the photoresist more than once. A portion of the light, already reflected from the surface of the underlying substrate can also reflect again from the surface of the photoresist, passing back through the photoresist yet again. In fact, standing light waves can result in the photoresist from superpositioning of incident and reflected light rays. These reflections result in process latitude and control problems.

The reflection of the light reduces the sharpness of the resulting photoresist pattern. A portion of the light reflected obliquely from the surface of the underlying substrate can also be again reflected obliquely from the surface of the photoresist. As a result of such angular reflections, the light can travel well outside those photoresist regions underlying the transmissive portions of the photolithographic mask. This potentially causes photoresist exposure well outside those photoresist regions underlying transmissive portions of the photolithographic mask. This problem results in a less sharply defined photoresist pattern that limits the density of structures formed on the integrated circuit.

The problem occurring from such reflections during the exposure step have been addressed by applying a bottom anti-reflective coating (BARC). The BARC layer minimizes reflected light during the photoexposure step thereby resulting in more faithfully reproduced trench walls. However, in most anti-reflective coatings, the anti-reflective layers need to be fine-tuned for greater process latitude. Thus, the thickness of the layers of the anti-reflective coating must be precisely controlled to obtain proper absorption of the reflected light in a particular application. Also, some BARCs are spun-on to wafers. When these spun-on coatings are applied over features with significant topography, the thickness of the coating varies. This can compromise their effectiveness as a BARC and make subsequent processing (removal) difficult or impossible.

In addition, after photoresist exposure, a BARC must be cleared from the developed-away regions of the photoresist. This may be performed using RIE, wet chemistry, sputter etch, ion milling, etc. Thinner, more uniformly distributed BARCs permit quick removal within minimum "over etch." This is important since these processes may have the undesired side effect of consuming some of the critical dimension (CD) budget because they (depending on materials choices and chemistry) consume photoresist or re-deposit non-volatile BARC-byproducts on the photoresist sidewalls.

Some bi-layer ARCs have been shown to dramatically reduce reflections in structures with low angle topographies (less than 30 degree) because of the reflection off the low angle features and absorption characteristics. The bi-layer ARC has been extremely useful in the recessed P3 (pole piece layer) process. However, the physics of a bi-layer stack is limited in its ability to achieve near zero reflectance at one of two highly different angles with respect to the wafer surface. For processes such as P3, the second angle is small enough such that reflectance can be minimized to near 5% for each angle (0 and 30 degrees). Nevertheless, for processes with more severe topography, for example those involving a dual layer coil, for example, the required angles to eliminate reflection become more like 0 and 60 degrees. In a bi-layer ARC design, it is physically impossible to achieve near zero reflectance at both of these angles.

It can be seen that there is a need to create an effective anti-reflective layer for wider topographies.

It can also be seen that there is a need to provide a thinner anti-reflective layer with wider process latitude.

SUMMARY OF THE INVENTION

To overcome the limitations in the prior art described above, and to overcome other limitations that will become apparent upon reading and understanding the present specification, the present invention discloses a method for forming thin film heads using a tri-layer anti-reflection coating for photolithographic applications and a structure thereof.

The present invention solves the above-described problems for wider topographies by providing conformal tri-layer bottom anti-reflection coatings that includes a first and a second dielectric layer, which has a substantially zero absorption, and an intermediate absorbing layer, which has an extinction coefficient (k) not equal to zero.

A method for forming thin film magnetic heads in accordance with the principles of the present invention includes forming a first dielectric layer on a surface, forming an absorption layer on the first dielectric layer, and forming a second dielectric layer on the absorption layer, wherein the absorption layer and the first and second dielectric layers are conformal to the surface.

A tri-layer bottom anti-reflection coating for minimizing pattern distortion in photolithography in accordance with the principles of the present invention includes a first dielectric layer of a first thickness formed on a surface, an absorption layer of a second thickness formed on the first dielectric layer and a second dielectric layer of a third thickness formed on the absorption layer, wherein the absorption layer and first and second dielectric layers are conformal to the surface.

A bottom anti-reflection structure in accordance with the principles of the present invention includes a conductive layer formed on a surface, a first dielectric layer of a first thickness formed on the conductive layer, an absorption layer of a second thickness formed on the first dielectric layer, a second dielectric layer of a third thickness formed on the absorption layer, wherein the absorption layer and the first and second dielectric layers are conformal to the surface, and a photoresist layer formed on the second dielectric layer, and wherein light is fully absorbed between the surface and the photoresist layer.

A thin film magnetic head in accordance with the principles of the present invention includes forming a first dielectric layer on a surface, forming an absorption layer on the first dielectric layer and forming a second dielectric layer on the absorption layer, wherein the absorption layer and the first and second dielectric layers are conformal to the surface.

A storage device in accordance with the principles of the present invention includes at least one data storage medium mounted for simultaneous rotation about an axis, at least one magnetic head mounted on an actuator assembly for reading and writing data on the at least one data storage medium and an actuator motor for moving the at least one magnetic head relative to the at least one data storage medium, wherein the head is formed using a photoresist process and wherein at least one stage in the photoresist process includes forming a first dielectric layer on a surface, forming an absorption layer on the first dielectric layer and forming a second dielectric layer on the absorption, wherein the absorption layer and the first and second dielectric layers are conformal to the surface.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings, which form a part hereof, and in which is shown by way of illustration the specific embodiment in which the invention may be practiced. It is to be understood that other embodiments may be utilized as structural changes may be made without departing from the scope of the present invention.

The present invention is a photolithographic technique used in thin-film head (TFH) and semiconductor processing. More particularly, a tri-layer anti-reflective coating (ARC) is used to minimize pattern distortion due to reflections from neighboring features for wide topographies. In photolithographic applications for thin film heads, a tri-layer ARC according to the present invention minimizes critical dimension and exposure variations.

Figure 1:
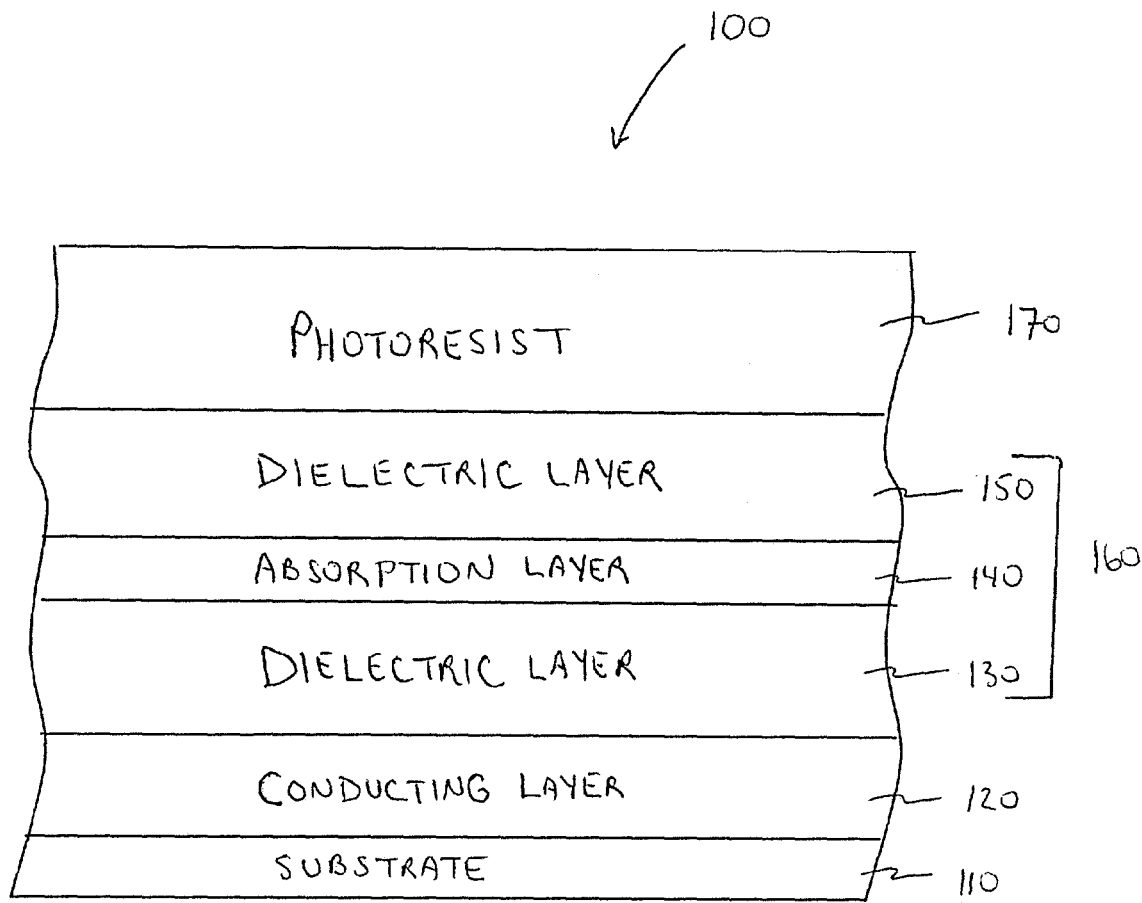
FIG. 1 is an illustration of a tri-layer dielectric-metal-dielectric anti-reflection coating for photolithographic applications according to the present invention.

FIG. 1 is an illustration of a tri-layer dielectric-metal-dielectric anti-reflection coating for photolithographic applications 100 according to the present invention. When the conducting layers 120 are made of reflective materials (e.g. metallic materials), anti-reflective coatings (ARCs) have been applied to reduce surface reflection. Typical surfaces benefiting from ARCs are layers formed of NiFe, FeN, aluminum, copper, titanium, or other reflective metals and their alloys. ARCs improve photoresist patterning control by reducing standing wave effects or diffuse scattering caused by reflection of radiation off reflective surfaces. These problems are magnified when monochromatic illumination sources are used.

A bottom anti reflective coating 160 may be deposited, before the photoresist 170, to prevent the reflection of light that passes through the photoresist 170, reflected off the substrate 110, reflective material 120, or other reflective features, and back into the photoresist 170, where it can interfere with incoming light and cause the photoresist to be unevenly exposed. Further, as the industry transitions to light with shorter wavelengths—from 248 nm to 150 nm and beyond, the challenges of minimizing reflections increase. Accordingly, as the wavelengths become shorter, the reflectivity of the substrate becomes higher, and as a result there are more problems with interference effects that affect the ability to get consistency in photoresist patterns.

Thus, one embodiment of the present invention resolves the problem by adding a BARC 160 to minimize pattern distortion due to reflections from neighboring features. The BARC 160 minimizes critical dimensions and exposure variations due to photoresist thickness (swing curve) effects. However, to be effective as a BARC 160, the BARC 160 must have an appropriate complex refractive index ($\tilde{n}$=n+ik, wherein n+ik is the real and imaginary parts of the complex refractive index $\tilde{n}$) and thickness so that reflections between substrate 110 (and/or reflective material 120) and photoresist 170 are fully dampened. Thus, such a BARC 160 may be positioned between the substrate 110 and the photoresist 170 in photolithographic applications.

In this embodiment of the present invention, a structure of a tri-layer BARC 160 consists of a first BARC layer 130, which is a dielectric layer such as $AL_2O_3$, $SiO_2$, $TiO_2$, $Ta_2O_5$, $Cr_2O_3$ etc. that has a substantially zero absorption, a second BARC layer 140, which is an absorbing layer such as Ta, Ti, Cr, Al, Ni, Ir etc. that has an extinction coefficient (k) not equal to zero, and a third BARC layer 150, which is another dielectric layer such as $AL_2O_3$, $SiO_2$, $TiO_2$, $Ta_2O_5$, $Cr_2O_3$ etc. that has a substantially zero absorption.

In the present invention, the effective thickness and refractive index of the tri-layer BARC structure 160 can be optimized to produce near-perfect anti-reflective properties. This optimization is possible by varying the thickness of the first 130, second 140 and third 150 ARC layers. In particular, the second ARC layer 140 may be varied on an overall percentage more than the first ARC layer 130 because of greater reflection in the first BARC layer 130. Thus, the present invention provides thinner BARC films with wider process latitude. Also, the ARC layers 130, 140, 150 may be formed, for example, using a vacuum deposition process. The tri-layer ARC 160 is formed by a vacuum deposition, such as chemical vapor deposition (CVD), physical vapor deposition (PVD), or ion beam deposition (IBD).

Further, with a tri-layer design 160 according to the present invention, it is now possible to achieve zero reflectance at two widely disparate angles. The tri-layer structure 160 can be optimized, for example, for 0 degree applications, wherein there is a thickness/materials limitation and wherein a bi-layer structure cannot minimize reflectance sufficiently.

Figure 2:
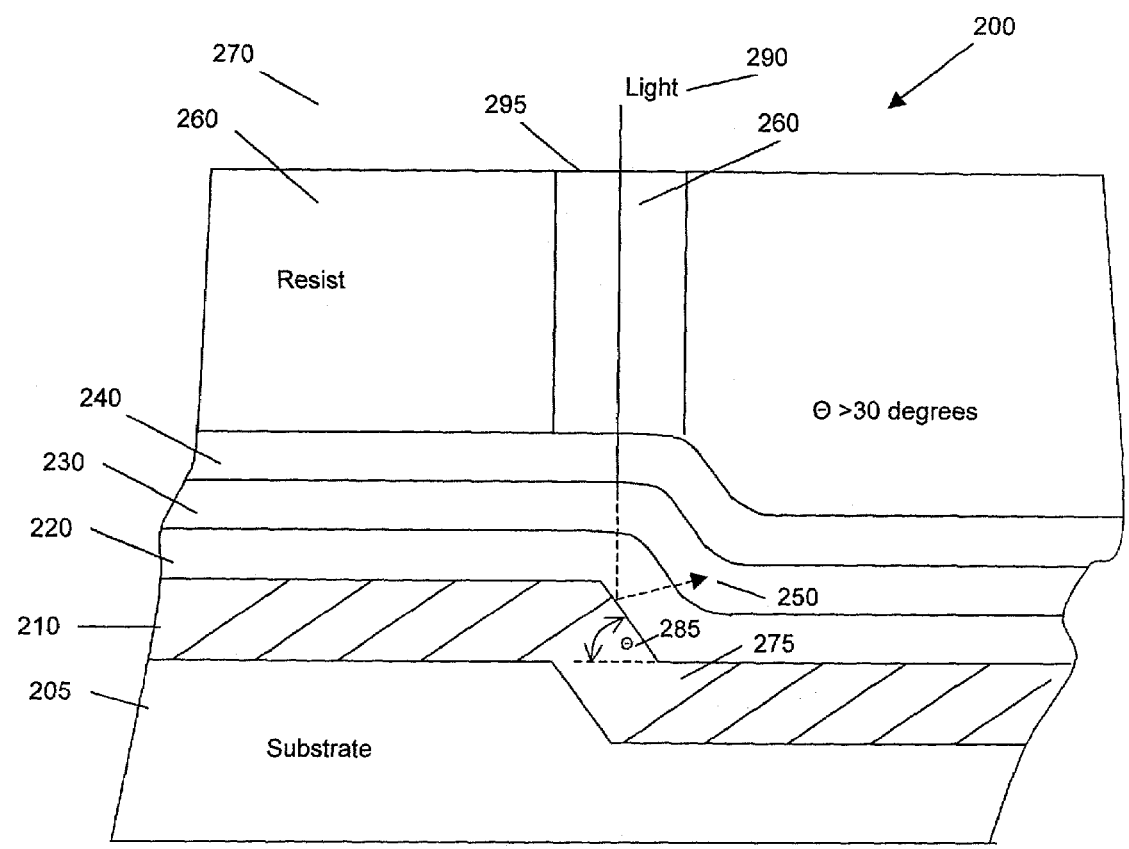
FIG. 2 illustrates the reflection of light in one embodiment of a tri-layer dielectric-metal-dielectric anti-reflection coating according to the present invention.

FIG. 2 illustrates the reflection of light in one embodiment of a tri-layer dielectric-metal-dielectric anti-reflection coating 200 according to the present invention. One component 290 of light, such as deep ultra-violet light (DUV) arriving from an environment 270, penetrates a photoresist surface 295 into the photoresist layer 260. The light 290 continues through the photoresist layer 260 into a first dielectric layer 240. The light 290 continues into an absorption layer 230. The light 290 continues to travel into a second dielectric layer 220.

In the present invention, the effective thickness and refractive index of the tri-layer ARC structure, including the first dielectric layer 220, the absorption layer 230, and second dielectric layer 240, can be optimized to produce near-perfect AR properties. This optimization is possible by varying the thickness of the first and second dielectric layers 220, 240 and the absorption layer 230. Nevertheless, the detailed functioning of the tri-layer BARC structure including the first dielectric layer 220, the absorption layer 230, and second dielectric layer 240, requires a detailed solution to wave equations and solving for maximum interference in the spacer and maximum attenuation in the absorber.

Thus, the light 290 may enter a surface that has topography, wherein part of the reflective structure's 210 surface 275 may be flat and having a first angle (not shown) of zero degrees. That means, for example, the angle of zero degrees is the same angle as the incident light 290. Also, the topology may have a second angle 285 being defined by a feature, which is not flat, but rather rises up from the surface 275 at a steep angle 285. Accordingly, the tri-layer antireflective coating 220, 230, 240 that is deposited conformally over this topography is successful in greatly reducing the amount of reflected light.

Thus, the present invention can minimize reflectance in small angles. Further, reflections from features with more severe topographies, such as those involving a dual layer coil for example, are also fully dampened.

Figure 3:
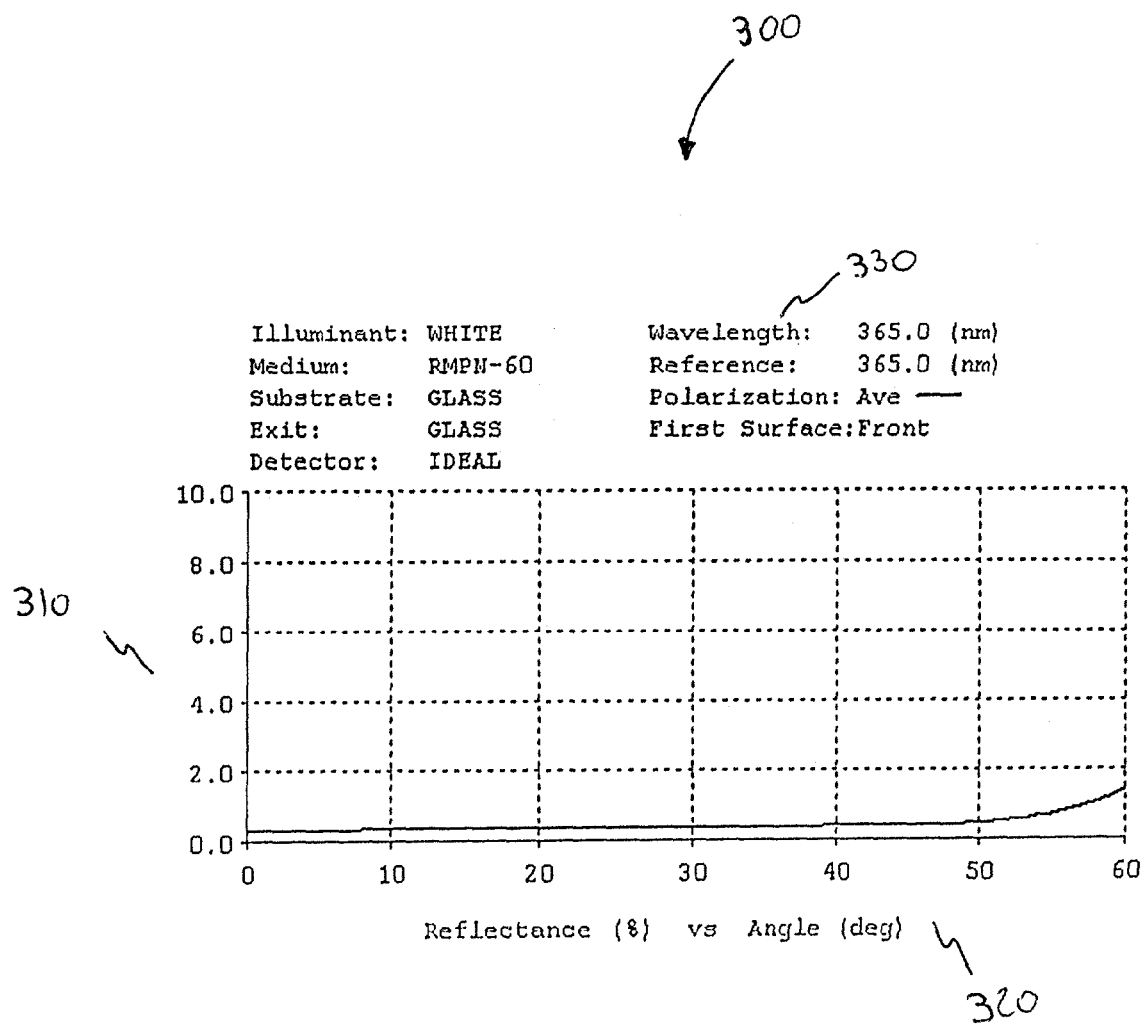
FIG. 3 illustrates the reflectivity in one embodiment of an anti-reflective coating as a function of a dielectric and absorption layer thickness according to the present invention.

FIG. 3 illustrates the reflectivity in one embodiment of an anti-reflective coating (ARC) as a function of a dielectric and absorption layer thickness 300 according to the present invention. In this embodiment, a representative calculation for a structure including a photoresist, first dielectric layer, absorption layer, second dielectric layer, and metal layers, such as, $Ta_2O_5$ at 325 Å (layer 1), Ta at 87 Å (layer 2), $Ta_2O_5$ at 340 Å (layer 3), and NiFe at 1000 Å, respectively, having a photoresist medium wherein n=1.71 at a wavelength of 365 nm 330.

At the optimum thickness for each layer, as described above in the ARC, the percent of reflected light at the top layer of $Ta_2O_5$ (FIG. 2 240), for example, for this particular system is 0.296% at 0 degrees and 1.397% and 60 degrees. For other choices the optimum thickness choice depends critically on the optical constants of all the materials and the wavelength.

The present invention is an improvement over other alternatives. Through its inherent conformality, it improves over spin-on ARCs (such as BARLi® Clariant) that, while effective, can have significant thickness variation (pooling) over topography, which require significant CD-losing over, etch during subsequent RIE processing. The present invention is an improvement over another alternative, Diamond-Like Carbon (DLC) films in that the present invention can be deposited with lower intrinsic mechanical stress. Such stress can create adhesion problems between BARC and substrate.

Also, a non-chlorine based chemistry may be used for patterning and stripping for some embodiments of the present invention. Several embodiments of the present invention will work without Cl, while others may require either Cl or alternatives as discussed above, e.g., sputter etch, milling or wet chemistry. For example, Ta, $Ta_2O_5$, $SiO_2$ and $Si_3N_4$ are all etchable without Cl, whereas other materials may require other techniques.

Figure 4:
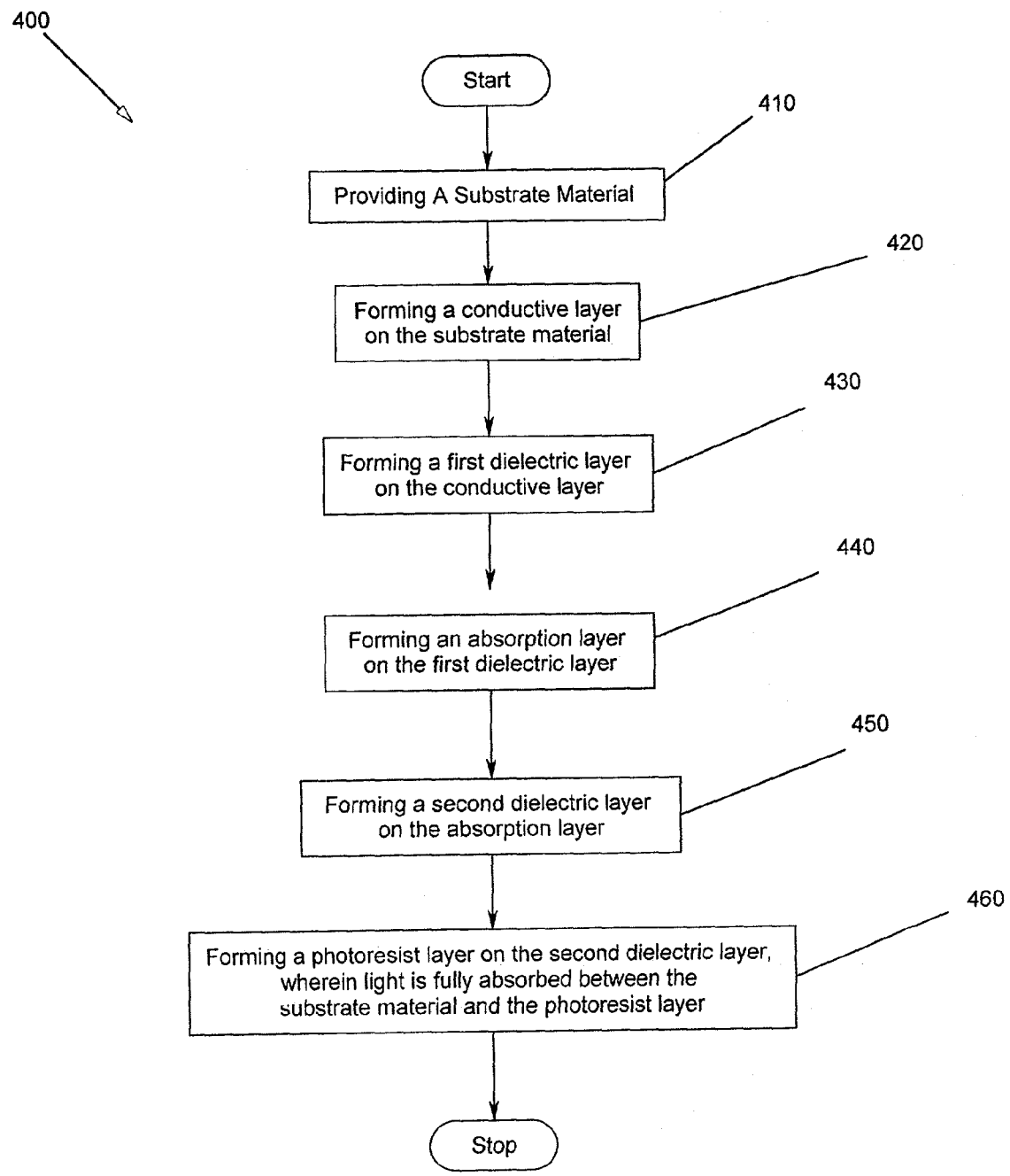
FIG. 4 is a flow chart of a process for creating a tri-layer bottom anti-reflection coating according to the present invention.

FIG. 4 is a flow chart of a process for creating a tri-layer bottom anti-reflection coating 400 according to the present invention. A substrate stack is provided 410. For example, a metal layer could be the substrate in thin film head applications and the substrate could be silicon in integrated circuit applications. A conductive layer is formed on the substrate material 420. While providing a substrate stack 410, and forming a conductive layer may be used, the present invention is directed to a dielectric-metal-dielectric tri-layer anti-reflective coating that pattern distortion due to reflections from neighboring features and is not meant to be limited to providing a substrate stack 410 and forming a conductive layer 420.

A first dielectric layer is then formed on the substrate layer by at least one vacuum deposition process 430. An absorption layer is formed on the first dielectric layer by at least one vacuum deposition process 440. A second dielectric layer is then formed on the absorption layer by at least one vacuum deposition process 450. Finally, a photoresist layer is formed on the dielectric layer, wherein light is fully absorbed between the substrate material and the photoresist layer 460.

Figure 5:
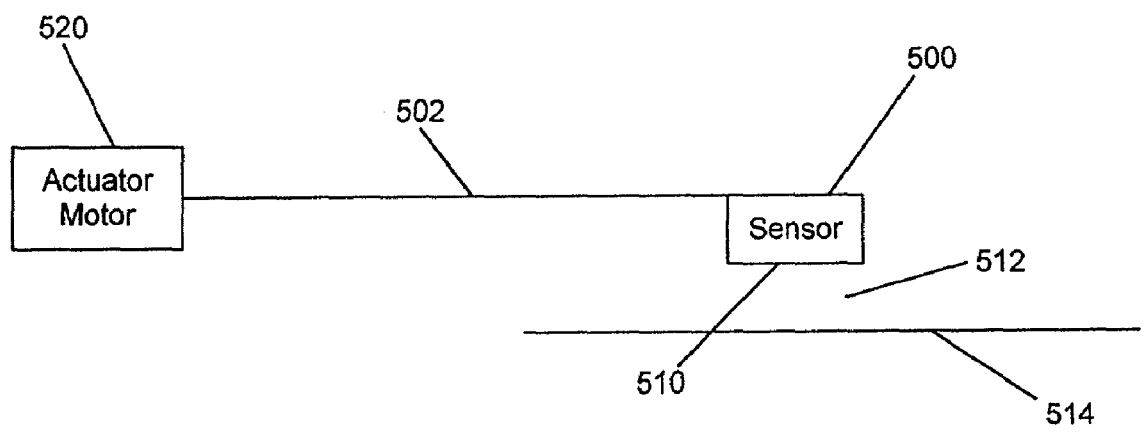
FIG. 5 illustrates a sensor that may be formed according to the present invention.

With reference now to FIG. 5, there is depicted a cross-sectional plan view of a sensor which may be formed using the method of the present invention. As illustrated, FIG. 5 depicts a plan view of the air-bearing surface of a sensor 500, e.g., a GMR head, MR head, tape head, etc. The air-bearing surface 510 of the sensor is mounted to a suspension or other mounting 502 and normally rides on a cushion of air 512, which separates it from a magnetic data storage medium 514, such as a disk or tape. An actuator motor 520 coupled to the mounting 502 controls the motion of the sensor 500.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for forming a tri-layer anti-reflective coating for minimizing pattern distortion in photolithography, comprising:
    forming a first dielectric layer directly on a surface having a non-planar surface;
    forming a metallic absorption layer directly on the first dielectric layer, wherein the metallic absorption layer absorbs surface reflections during photolithography; and
    forming a second dielectric layer directly on the metallic absorption layer to complete a tri-layer coating, wherein the metallic absorption layer and the first and second dielectric layers are conformal to the non-planar surface,
    wherein the forming of the first dielectric layer, metallic absorption layer and second dielectric layer provide near zero surface reflectance during photolithography.

2. The method of claim 1, wherein the forming of the first and second dielectric layers and metallic absorption layer further comprises forming the first dielectric layers with a first thickness, forming the second dielectric layer with a second thickness, and forming the metallic absorption layer with a third thickness.

3. The method of claim 1, wherein the forming the first and second dielectric layers further comprises depositing a dielectric having substantially zero absorption at a predetermined wavelength.

4. The method of claim 1, wherein the forming the metallic absorption layer further comprises depositing an absorbing material having an extinction coefficient (k) not equal to zero at a predetermined wavelength.

5. The method of claim 1, wherein the forming of the first and second dielectric layers and the metallic absorption layer is accomplished by a vacuum deposition.

6. The method of claim 5, wherein the depositing the vacuum deposition process further comprises at least one of chemical vapor deposition, physical vapor deposition and ion beam coating deposition.

7. The method of claim 1, wherein forming the first dielectric layer, the second dielectric layer and the metallic absorption layer comprises forming an anti-reflective layer.

8. The method of claim 1, wherein the first dielectric layer, the second dielectric layer and the metallic absorption layer achieves substantially zero reflectance for a predetermined wavelength at a plurality of topographical angles of the non-planar surface.

9. The method of claim 1, wherein forming the first and second dielectric layers and the metallic absorption layer further comprises determining a thickness of the first and second dielectric layers and the metallic absorption layer that results in an anti-reflection property of the combined first dielectric layer, second dielectric layer and metallic absorption layer.

10. The method of claim 9, wherein determining the thickness of the first dielectric layer, second dielectric layer and the metallic absorption layer includes allowing the thickness of the metallic absorption layer to be more varied on an overall percentage than the first dielectric layer.

11. The method of claim 1 further comprising forming a photoresist layer on the second dielectric layer.

12. The method of claim 1, wherein forming the first dielectric layer, second dielectric layer and the metallic absorption layer further comprises fully absorbing light in the metallic absorption and/or the first and second dielectric layers.

13. The method of claim 1 further comprises forming features on the surface, wherein the metallic absorption layer and first and second dielectric layers are formed conformally over the features.

14. The method of claim 13 further comprises fully absorbing light reflected off the surface and the features formed on the surface by the metallic absorption layer and/or the first and second dielectric layers.

15. A tri-layer bottom anti-reflection coating for minimizing pattern distortion in photolithography, comprising:
    a first dielectric layer of a first thickness formed on a non-planar surface;
    a metallic absorption layer of a second thickness formed directly on the first dielectric layer, wherein the metallic absorption layer absorbs surface reflections during photolithography; and
    a second dielectric layer of a third thickness formed directly on the metallic absorption layer to complete a tri-layer coating, wherein the metallic absorption layer and first and second dielectric layers are conformal to the non-planar surface,
    wherein the first dielectric layer, metallic absorption layer and second dielectric layer provide near zero surface reflectance during photolithography.

16. The tri-layer bottom anti-reflection coating of claim 15, wherein the first and second dielectric layers have substantially zero absorption for a predetermined wavelength.

17. The tri-layer bottom anti-reflection coating of claim 15, wherein the metallic absorption layer has an extinction coefficient (k) not equal to zero for a predetermined wavelength.

18. The tri-layer bottom anti-reflection coating of claim 15, wherein the metallic absorption layer, and the first and second dielectric layers, are deposited by vacuum deposition.

19. The tri-layer bottom anti-reflection coating of claim 18, wherein the vacuum deposition process further comprises at least one of chemical vapor deposition, physical vapor deposition and ion beam deposition.

20. The tri-layer bottom anti-reflection coating of claim 15, wherein an anti-reflective layer is formed by the first dielectric layer and the second dielectric layer being disposed on the metallic absorption layer.

21. The tri-layer bottom anti-reflection coating of claim 15, wherein the first dielectric layer, the second dielectric layer and the metallic absorption layer achieves substantially zero reflectance for a predetermined wavelength at a plurality of topographical angles of the non-planar surface.

22. The tri-layer bottom anti-reflection coating of claim 15, wherein a thickness of the first dielectric layer, the second dielectric layer and the metallic absorption layer is formed that results in an anti-reflection property of the combined metallic absorption layer and dielectric layers.

23. The tri-layer bottom anti-reflection coating of claim 22, wherein the thickness of the first dielectric layer, the second dielectric layer and the metallic absorption layer varies to include allowing the thickness of the metallic absorption layer to be more varied on an overall percentage than the first dielectric layer.

24. The tri-layer bottom anti-reflection coating of claim 15 further comprises a photoresist layer formed on the second dielectric layer, wherein light is fully absorbed in the metallic absorption layer and/or the second dielectric layer.

25. A bottom anti-reflection structure, comprising:
a conductive layer formed on a non-planar surface;
a first dielectric layer of a first thickness formed directly on the conductive layer;
a metallic absorption layer of a second thickness formed directly on the first dielectric layer, wherein the metallic absorption layer absorbs surface reflections during photolithography;
a second dielectric layer of a third thickness formed directly on the metallic absorption layer to complete a tri-layer coating, wherein the metallic absorption layer and the first and second dielectric layers are conformal to the non-planar surface; and
a photoresist layer formed directly on the second dielectric layer, wherein light is fully absorbed between the surface and the photoresist layer,
wherein the first dielectric layer, metallic absorption layer, second dielectric layer and photoresist layer provide near zero surface reflectance during photolithography.

26. The bottom anti-reflection structure of claim 25, wherein the first and second dielectric layers have a substantially zero absorption for a predetermined wavelength.

27. The bottom anti-reflection structure of claim 25, wherein the metallic absorption layer has an extinction coefficient (k) not equal to zero for a predetermined wavelength.

28. The bottom anti-reflection structure of claim 25, wherein the first and second dielectric layers and the metallic absorption layer are formed by a vacuum deposition process.

29. The bottom anti-reflection structure of claim 25, wherein the metallic absorption layer and/or first and second dielectric layers fully absorbs light.

30. The bottom anti-reflection structure of claim 25 further comprises forming features on the surface, wherein the metallic absorption layer and the first and second dielectric layers are formed conformally over the features.

31. The bottom anti-reflection structure of claim 30 further comprises fully absorbing light reflected off the surface and the features formed on the surface by the metallic absorption layer and/or first and second dielectric layers.

32. A thin film magnetic head formed by a method comprising:
forming a first dielectric layer directly on a non-planar surface;
forming a metallic absorption layer directly on the first dielectric layer, wherein the metallic absorption layer absorbs surface reflections during photolithography; and
forming a second dielectric layer directly on the metallic absorption layer to complete a tri-layer coating, wherein the metallic absorption layer and the first and second dielectric layers are conformal to the non-planar surface,
wherein the forming of the first dielectric layer, metallic absorption layer and second dielectric layer provide near zero surface reflectance during photolithography.

33. A storage device, comprising:
at least one data storage medium mounted for simultaneous rotation about an axis;
at least one magnetic head mounted on an actuator assembly for reading and writing data on the at least one data storage medium; and
an actuator motor for moving the at least one magnetic head relative to the at least one data storage medium; and
wherein the head is formed using a photoresist process and wherein at least one stage in the photoresist process includes forming a tri-layer anti-reflective coating for minimizing pattern distortion in photolithography, the forming the tri-layer anti-reflective coating comprising:
forming a first dielectric layer directly on a non-planar surface;
forming metallic absorption layer directly on the first dielectric layer, wherein the metallic absorption layer absorbs surface reflections during photolithography; and
forming a second dielectric layer directly on the metallic absorption layer to complete a tri-layer coating, wherein the metallic absorption layer and the first and second dielectric layers are conformal to the non-planar surface,
wherein the first dielectric layer, metallic absorption layer and second dielectric layer provide near zero surface reflectance during photolithography.

34. The storage device of claim 33, wherein the head is a GMR head.

35. The storage device of claim 33, wherein the head is an MR head.

36. The storage device of claim 33, wherein the head is a head configured for use with a data storage medium comprising magnetic tape.

* * * * *